United States Patent
De Boer et al.

(10) Patent No.: US 6,417,536 B2
(45) Date of Patent: *Jul. 9, 2002

(54) SEMICONDUCTOR DEVICE WITH MEMORY CAPACITOR HAVING AN ELECTRODE OF $SI_{1-x}GE_x$

(75) Inventors: Wiebe B. De Boer; Marieke C. Martens, both of Eindhoven (NL)

(73) Assignee: Koninklijke Philips Electronics N.V., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/111,613

(22) Filed: Jul. 7, 1998

(30) Foreign Application Priority Data

Jul. 8, 1997 (EP) ............................................. 97202105

(51) Int. Cl.[7] ........................ H01L 29/68; H01L 27/108; H01L 29/74; H01L 29/94
(52) U.S. Cl. ...................... 257/309; 257/616; 257/534; 257/295; 257/301; 257/190; 257/68; 257/296; 257/308; 361/313; 438/309
(58) Field of Search ................................ 257/616, 534, 257/309, 295, 301, 190, 68, 296, 308; 438/309; 361/313

(56) References Cited

U.S. PATENT DOCUMENTS

| | | | |
|---|---|---|---|
| 5,130,885 A | | 7/1992 | Fazan et al. ............... 361/313 |
| 5,155,657 A | * | 10/1992 | Oehrlein et al. ........... 361/313 |
| 5,245,206 A | * | 9/1993 | Chu et al. ................... 257/309 |
| 5,384,152 A | * | 1/1995 | Chu et al. ................... 257/309 |
| 5,573,979 A | * | 11/1996 | Tsu et al. |
| 5,619,393 A | * | 4/1997 | Summerfelt et al. ...... 361/321.1 |
| 5,770,500 A | | 6/1998 | Batra et al. ................. 438/255 |
| 6,060,355 A | * | 5/2000 | Batra et al. ................. 257/309 |
| 6,124,607 A | * | 9/2000 | Sandhu et al. ............. 257/309 |
| 6,127,220 A | * | 10/2000 | Large et al. ................ 438/254 |
| 6,140,173 A | * | 10/2000 | Wolters et al. ............. 438/240 |
| 6,150,207 A | * | 11/2000 | Chung et al. ............... 438/239 |
| 6,150,208 A | * | 11/2000 | Deboer et al. ............. 438/240 |
| 6,150,217 A | * | 11/2000 | Chang et al. .............. 438/255 |
| 6,204,119 B1 | * | 3/2001 | Large et al. ................ 438/254 |

OTHER PUBLICATIONS

"Hemispherical Grain Silicon for High Density DRAMs", by Watanabe et al, Solid State Technology, Jul. 1992, pp. 29–33.

* cited by examiner

Primary Examiner—Alexander O. Williams
(74) Attorney, Agent, or Firm—Steven R. Biren

(57) ABSTRACT

A semiconductor device with a semiconductor body (1) provided with a memory capacitor (12, 26) with a lower electrode (11, 23) consisting of a layer of semiconductor material (7, 23) having a rough surface (8, 24) formed by hemispherical grains (9, 25) of the relevant semiconductor material on which a dielectric layer (12, 27) and an upper electrode (13, 28) are provided. The semiconductor material from which the lower electrode is manufactured is $Si_{1-x}Ge_x$, wherein $0.2<x<1$. The semiconductor device can be manufactured in a simple manner because a layer of $Si_{1-x}Ge_x$ having a rough surface formed by hemispherical grains of this material can be simply directly formed through deposition by means of usual CVD (Chemical Vapor Deposition) processes.

1 Claim, 2 Drawing Sheets

SEMICONDUCTOR DEVICE WITH MEMORY CAPACITOR HAVING AN ELECTRODE OF $SI_{1-x} GE_x$

BACKGROUND OF THE INVENTION

The invention relates to a semiconductor device with a semiconductor body provided with a memory capacitor having a lower electrode comprising a layer of semiconductor material with a rough surface formed by hemispherical grains of said semiconductor material, on which a dielectric layer and an upper electrode are provided. The invention also relates to a method of manufacturing such a device.

The semiconductor device is, for example, a DRAM (Dynamic Random Access Memory). It is of essential importance in such memories that a memory capacitor should occupy no more than a very small portion of the surface area of the semiconductor body. In practice, a surface area of approximately 1.5 $\mu m^2$, for example, is available for each memory cell in a 64 Mbit memory of this kind, and approximately 1 $\mu m^2$ for the memory capacitor present in each cell. To form a memory capacitor having as high a capacitance as is possible on such a small surface area, this capacitor is at least partly formed transversely to the surface of the semiconductor body in practice. The capacitor thus becomes larger, while it does not occupy any additional space as seen in projection on the surface of the semiconductor body. The memory capacitor is formed, for example, in a groove or on a mesa (node). Furthermore, the capacitance value is increased in that the lower electrode is given a rough surface. An important increase is obtained in that the lower electrode of the memory capacitor is formed in a layer of semiconductor material having a rough surface formed by hemispherical grains of the relevant semiconductor material. The dielectric layer may be a layer of silicon oxide, but in practice a dielectric layer is often used comprising a dual layer of silicon oxide and silicon nitride. The upper electrode is usually made of polycrystalline silicon.

A device of the kind mentioned in the opening paragraph is known from "Hemispherical Grain Silicon for High Density DRAMs" by H. Watanabe et al., Solid State Technology, July 1992, pp. 29–33, wherein the lower electrode is formed in a layer of silicon. Two methods are described in this article for forming a layer with a hemispherical grain silicon surface. In the first method, the layer is directly formed through deposition by means of a usual LPCVD (Low Pressure Chemical Vapor Deposition) process from a gas mixture comprising silane and helium. In the second method, a layer of amorphous silicon is first deposited by means of this same LPCVD process, whereupon this layer is converted by heating into a layer having a surface consisting of hemispherical grains.

It is found in the first method that the temperature at which the desired granular layer is formed is highly critical. The desired layer is formed at a temperature of 590° C., but it is not at temperatures of 580° C. and lower or 600° C. and higher. In the second method, the temperature at which the heating must take place is less critical, but here equipment is required which renders possible heating under high vacuum at a pressure of approximately $10^{-7}$ torr. Both methods are not very suitable for use in practice, the first method because the temperature at which the deposition is to take place is critical, the second method because very costly vacuum equipment is required for it.

SUMMARY OF THE INVENTION

The invention has for its object to provide a semiconductor device of the kind mentioned in the opening paragraph which can be manufactured in a simpler manner. According to the invention, this semiconductor device is for this purpose characterized in that the semiconductor material from which the lower electrode is manufactured is $Si_{1-x}Ge_x$, with $0.2<x<1$.

Such a semiconductor device can be manufactured in a simple manner because a layer of $Si_{1-x}Ge_x$ with a rough surface formed by hemispherical grains of this material can be directly formed simply by deposition by means of usual CVD (Chemical Vapor Deposition) processes from gas mixtures which comprise usual silicon and germanium compounds such as, for example, $SiH_4$ or $SiH_2Cl_2$ and $GeH_4$. These processes may be carried out both at atmospheric pressure and at reduced pressure. The temperature at which these processes are to be carried out is not very critical. The semiconductor body is preferably heated to a temperature of between 450° C. and 700° C. A layer is deposited in this manner having the d desired rough surface formed by hemispherical grains of the material, w which grains have diameters from 30 to 150 nm. A deposition process is then obtained at the same time by which the layer of $Si_{1-x}Ge_x$ is deposited at a practical deposition rate of 1 to 10 nm per minute. To obtain the desired small grains of between 30 and 150 nm diameter, layers with x<0.2 have to be deposited at undesirably high temperatures of more than 700° C., with x=0.1 even up to 850° C.

In a preferred embodiment of the semiconductor device according to the invention, the lower electrode is formed on a conductor of polycrystalline silicon which lies on a layer of insulating material. A layer of $Si_{1-x}Ge_x$ with $0.2<x<1$ can be deposited very selectively on polycrystalline silicon. In practice, Cl is added to the gas mixture from which the layer is deposited in that case. Mixtures are then used comprising $SiH_4$, $GeH_4$, and HCl or $SiH_2Cl_2$ and $GeH_4$. After the conductor of polycrystalline silicon has been formed, for example in the form of a mesa (node), a lower electrode having a rough surface may then be formed in a self-aligned manner on this conductor for the formation of a memory capacitor. No material is deposited on the layer of insulating material during this.

BRIEF DESCRIPTION OF THE DRAWINGS

The invention will be explained in more detail below by way of example with reference to a drawing and a few examples. In the drawing.

DESCRIPTION OF THE PREFERRED EMBODIMENTS

Figure 1:
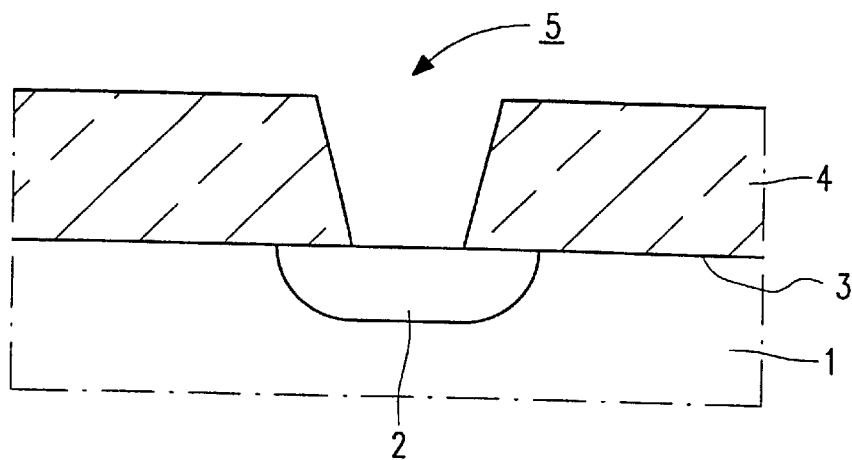
FIGS. 1 to 3 diagrammatically and in cross-section show a few stages in the manufacture of a first embodiment of a semiconductor device according to the invention, and FIGS. 4 to 6 diagrammatically and in cross-section show a few stages in the manufacture of a second embodiment of a semiconductor device according to the invention.
Figure 2:
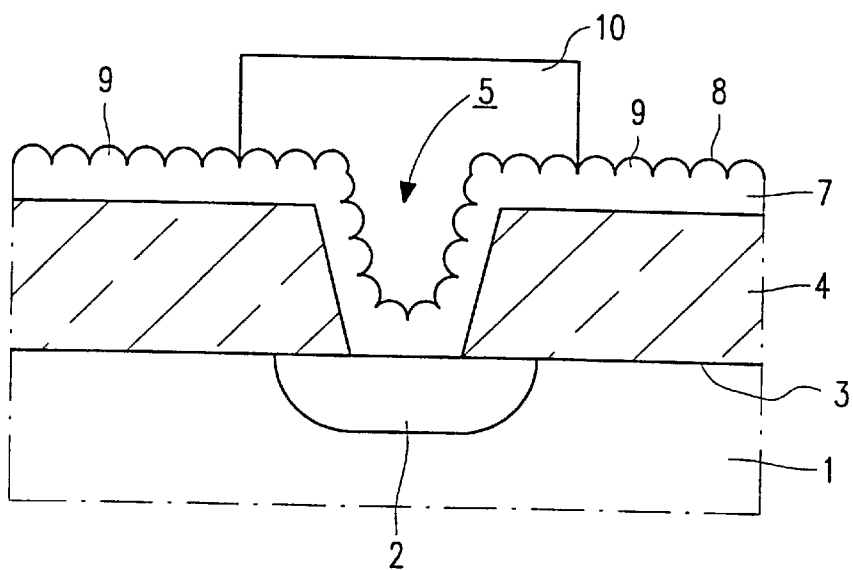
Figure 3:
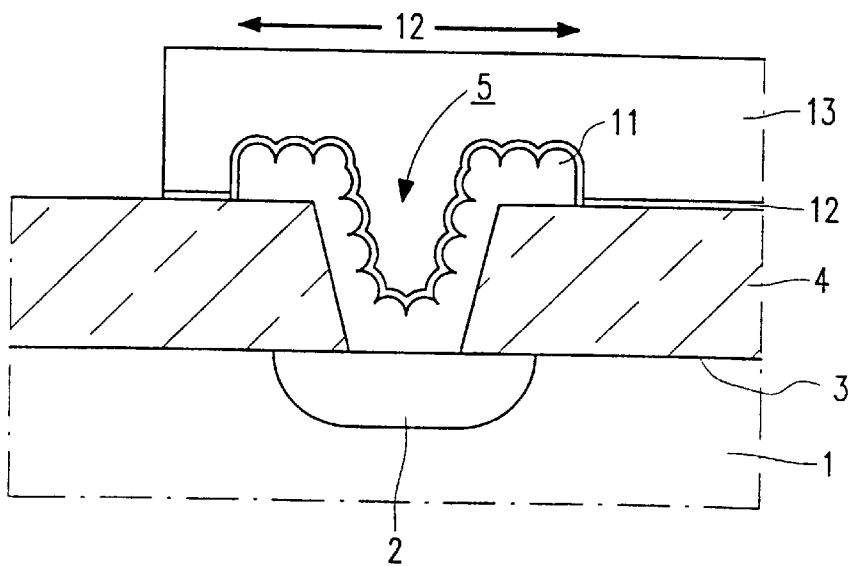

FIGS. 1 to 3 diagrammatically and in cross-section show a few stages in the manufacture of a first embodiment of a semiconductor device according to the invention. Manufacture starts with a semiconductor body 1 of silicon in which a semiconductor zone 2 is formed which adjoins a surface 3 of the semiconductor body 1. The zone 2 forms, for example, a word line of a DRAM. An approximately 500 nm thick insulating layer 4 of, for example, silicon oxide is provided on the surface 3. A window 5, having a diameter of approximately 500 nm and walls 6 which are at an angle to the surface 3, is formed in the insulating layer 4. The window is round in this case, but it may alternatively be elongate and have the shape of a groove then.

Subsequently an approximately 200 nm thick layer of semiconductor material 7 is deposited, with a rough surface 8 formed by hemispherical grains 9 of said semiconductor material. This layer of semiconductor material 7 is rendered conducting by doping with a dopant such as, for example, phosphorus. The doping may take place during the deposition process in that, for example, $PH_3$ is added to the gas mixture from which the layer is deposited.

After a photoresist mask 10 has been provided on the layer of semiconductor material 7, a lower electrode 11 for a memory capacitor 12 is formed in the layer by etching. After this, an approximately 7 nm thick dielectric layer 12 of silicon oxide is deposited on the lower electrode 11. Then a layer of doped polycrystalline silicon is deposited, in which the upper electrode 13 of the memory capacitor is formed by etching.

Figure 4:
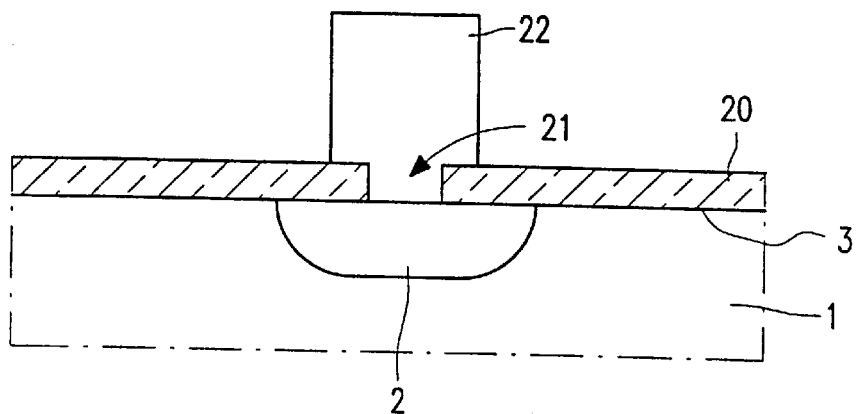
Figure 5:
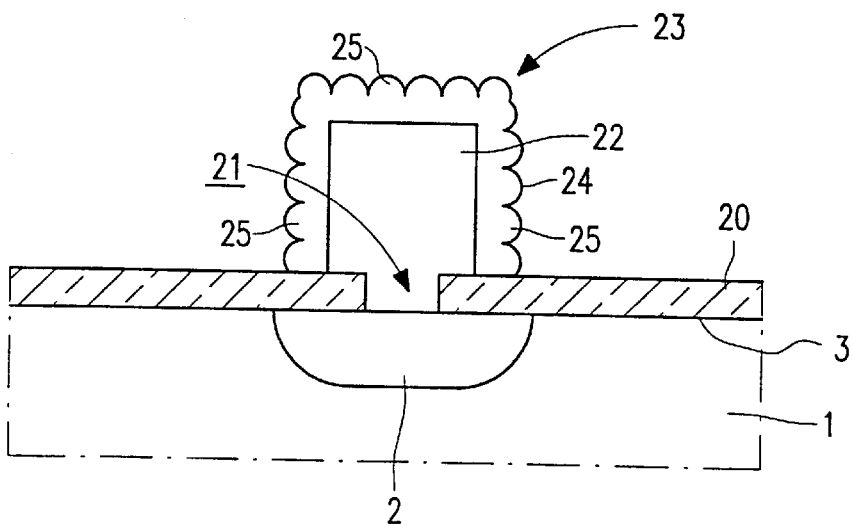
Figure 6:
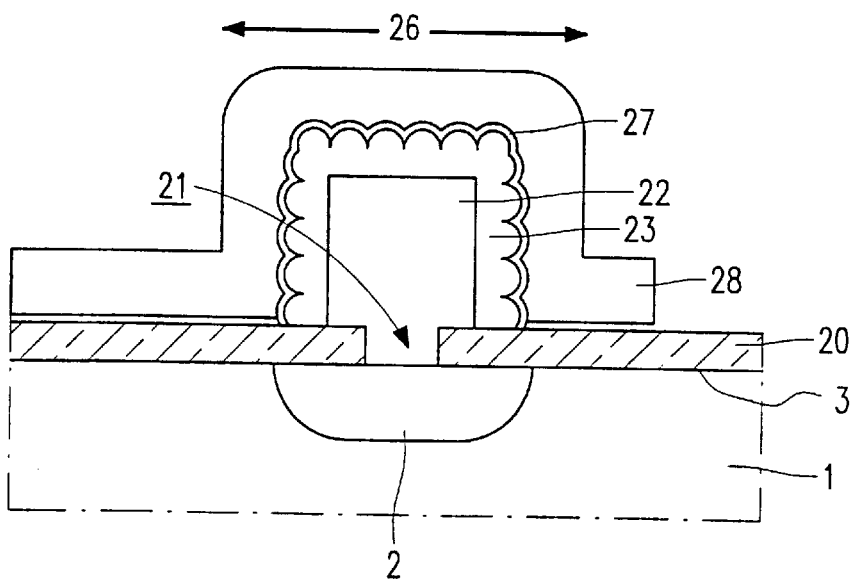

FIGS. 4 to 6 diagrammatically and in cross-section show a few stages in the manufacture of a second embodiment of a semiconductor device according to the invention. Manufacture starts again with a semiconductor body 1 of silicon in which a semiconductor zone 2 is formed which adjoins a surface 3 of the semiconductor body 1. The zone 2 forms, for example, a word line of a DRAM also in this case. An insulating layer 20 of, for example, silicon oxide is provided on the surface 3. A window is formed in the insulating layer 20. An approximately 500 nm high conductor 22 with a diameter of approximately 500 nm and made of doped polycrystalline silicon is formed on the insulating layer 20. This conductor here is a cylinder, but it may alternatively take the shape of a mesa (a cylinder or a block having walls which are at an angle to the surface 3).

An approximately 200 nm thick layer of semiconductor material 23 with a rough surface 24 formed by hemispherical grains 25 of this semiconductor material is selectively deposited on the conductor 22. This layer of semiconductor material 23 is rendered conducting by doping with a dopant such as, for example, phosphorus. The doping may take place during the deposition. Since the deposition takes place selectively, the portion of the insulating layer 20 situated next to the conductor 22 is not covered with this semiconductor material.

A lower electrode 23 of a memory capacitor 26 is directly formed in a self-aligned manner because the deposition of the layer of semiconductor material is a selective process. Subsequently, an approximately 7 nm thick dielectric layer 27, here made of silicon oxynitride, is deposited on the lower electrode 11. Then a layer of doped polycrystalline silicon is deposited, in which the upper electrode 28 of the memory capacitor is formed by etching.

The two embodiments of the memory capacitors 12, 26 described above each occupy a comparatively small portion of the surface area 3 of the semiconductor body 1 because they are formed in a groove or window 5 or on a cylindrical conductor 22 or mesa. Both capacitors are no larger than 1 $\mu m^2$. A capacitor having a comparatively high capacitance value is thus formed on a comparatively small surface area. An additional increase in the capacitance is obtained in that the lower electrode 11, 23 is made from a layer of semiconductor material 7, 23 having a rough surface 8, 24 formed by hemispherical grains 9, 25 of the semiconductor material.

In both semiconductor devices described above, the lower electrode 1, 23 is manufactured from $Si_{1-x}Ge_x$ with 0.2<x<1. These semiconductor devices may be manufactured in a simple manner because the layer of $Si_{1-x}Ge_x$, 7, 23 can be simply directly formed through deposition by means of usual CVD (Chemical Vapor Deposition) processes from gas mixtures which contain usual silicon and germanium compounds such as, for example, $SiH_4$ or $SiH_2Cl_2$ and $GeH_4$. These processes may be carried out both at atmosphereic pressure and at reduced pressure in this case. The temperature at which these processes are to be carried out is not very critical. The semiconductor body is preferably heated to a temperature of between 450° C. and 700° C. Layers 7, 23 having surfaces 8, 24 with hemispherical grains 9, 25 of 30 to 150 nm diameter are deposited in this manner. Deposition processes are thus obtained at the same time by which the layer of $Si_{1-x}Ge_x$, is deposited at a practical deposition rate of 1 to 10 nm per minute. To obtain the desired small grains, layers with x<0.2 have to be deposited at undesirably high temperatures of more than 700° C., even up to 800° C. for x=0.1, in order to obtain the desired grain structure.

In the second embodiment, the lower electrode 23 is formed on a conductor 22 of polycrystalline silicon which lies on a layer 20 of insulating material. A layer of $Si_{1-x}Ge_x$ with 0.2<x<1 can be deposited highly selectively on polycrystalline silicon. In practice, Cl is added to the gas mixture from which the layer is deposited in that case, as is indeed the case for a mixture of $SiH_4$, $GeH_4$ and HCl, or a mixture of $SiH_2Cl_2$ and $GeH_4$.

In the examples given below, layers were deposited on the surface of (100) Si wafers in an ASM-A-600 reactor, on which wafer silicon oxide surfaces had been formed in a checkerboard pattern. Before the layers were deposited, the surfaces were cleaned in a usual manner by means of a combination of an HF dip, an HF vapor etching treatment, and a baking step in $H_2$ at 1000° C.

1. A 220 nm thick layer was deposited at a growing rate of 3.6 nm per minute from a gas mixture containing 400 sccm $GeH_4$ (1% in $H_2$) and 20 sccm $SiH_4$ at a pressure of 150 mTorr and a temperature of 620° C. A layer with x=0.28 and a grain size of 150 nm was deposited in this manner.

2. A 325 nm thick layer was deposited at a growing rate of 5.4 nm per minute from a gas mixture comprising 400 sccm $GeH_4$ (1% in $H_2$) and 20 sccm $SiH_4$ at a pressure of 150 mTorr and a temperature of 510° C. A layer with x=0.38 and a grain size of 50 nm was deposited thereby.

3. A 90 nm thick layer was deposited at a growing rate of 1.3 nm per minute from a gas mixture comprising 7.1 sccm $GeH_4$ (100%) and 100 sccm $SiH_4$ at a pressure of 450 mTorr and a temperature of 460° C. A layer with x=0.30 and a grain size of 30 nm was thus deposited.

4. A 250 nm thick layer was deposited at a growing rate of 2.2 nm per minute from a gas mixture comprising 14.2 sccm $GeH_4$ (100%) and 100 sccm $SiH_4$ at a pressure of 450 mTorr and a temperature of 460° C. A layer with x=0.40 and a grain size of 150 nm was thus deposited.

5. A 170 nm thick layer was deposited at a growing rate of 3.0 nm per minute from a gas mixture comprising 4.7 sccm $GeH_4$ (100%) and 100 sccm $SiH_2Cl_2$ at a pressure of 500 mTorr and a temperature of 700° C. A layer with x=0.25 and a grain size of 100 nm was thus deposited.

6. A 100 nm thick layer was deposited at a growing rate of 5.0 nm per minute from 21.4 sccm $GeH_4$ (100%) at a pressure of 150 mTorr and a temperature of 460° C. A layer with x=1 and a grain size of 50 nm was thus deposited. The layer was deposited on silicon and not on silicon oxide with high selectivity in the examples 5 and 6.

What is claimed is:

1. A semiconductor device with a semiconductor body provided with a memory capacitor having a lower electrode comprising a localized layer of doped, deposited semiconductor material with a rough surface formed by hemispherical grains of said semiconductor material, on which a dielectric layer and an upper electrode are provided, wherein the semiconductor material from which the lower electrode is manufactured is $Si_{1-x}Ge_x$, with $0.2<x<1$, and wherein the lower electrode is formed on a localized protrusion of a conductor of polycrystalline silicon which lies at least partly on a layer of insulating material.

* * * * *